(12) United States Patent
Champion et al.

(10) Patent No.: US 10,230,362 B2
(45) Date of Patent: Mar. 12, 2019

(54) ENHANCED RESONANT CIRCUIT AMPLIFIER

(71) Applicant: Microsoft Technology Licensing, LLC, Redmond, WA (US)

(72) Inventors: Mark Champion, Kenmore, WA (US); Lev Cherkashin, Redmond, WA (US); Jonathan Alan Dutra, Saratoga, CA (US); Eric P. Filer, Renton, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 148 days.

(21) Appl. No.: 15/482,652

(22) Filed: Apr. 7, 2017

(65) Prior Publication Data

US 2018/0183424 A1    Jun. 28, 2018

Related U.S. Application Data

(60) Provisional application No. 62/438,968, filed on Dec. 23, 2016.

(51) Int. Cl.
*H03K 3/017* (2006.01)
*H03K 7/08* (2006.01)

(52) U.S. Cl.
CPC ..................................... *H03K 7/08* (2013.01)

(58) Field of Classification Search
None
See application file for complete search history.

(56) References Cited

U.S. PATENT DOCUMENTS

| | | | |
|---|---|---|---|
| 4,271,392 A | 6/1981 | Outram et al. | |
| 4,276,514 A | 6/1981 | Huang | |
| 4,501,002 A | 2/1985 | Auchterlonie | |

(Continued)

FOREIGN PATENT DOCUMENTS

| | | | |
|---|---|---|---|
| CN | 103151995 A | 6/2013 | |
| EP | 0664607 A2 | 7/1995 | |

OTHER PUBLICATIONS

"Class C power amplifier", Published on: Aug. 24, 2009 Available at: http://www.circuitstoday.com/class-c-power-amplifier.

(Continued)

*Primary Examiner* — Lincoln Donovan
*Assistant Examiner* — Khareem E Almo
(74) *Attorney, Agent, or Firm* — Newport IP, LLC; Scott Y. Shigeta

(57) ABSTRACT

Techniques for providing an enhanced resonant circuit amplifier are described herein. Using a capacitor to couple the drive to the resonant circuit can be problematic because the current flows the same direction with every energy burst, which causes the coupling capacitor to charge up and stop injecting energy into the resonant circuit. To solve this issue, embodiments disclosed herein add a burst of energy once every half cycle. This reduces distortion in the resonant energy. A second benefit is the ability to "push in" and "pull out" energy from the resonant circuit, which can prevent the capacitor from charging up and allow a resonant circuit amplifier to continually produce a symmetric, stable output. In addition, a controller can dynamically modify a number of aspects of an output, e.g., an amplitude and/or a DC bias, by modifying the duty cycle of an input signal.

19 Claims, 13 Drawing Sheets

(56) References Cited

U.S. PATENT DOCUMENTS

| | | | |
|---|---|---|---|
| 4,972,438 A | 11/1990 | Silvian | |
| 5,319,315 A | 6/1994 | Belcher | |
| 5,493,257 A | 2/1996 | Chadwick | |
| 5,705,959 A | 1/1998 | O'Loughlin | |
| 5,789,979 A | 8/1998 | Kumar et al. | |
| 7,342,387 B1 | 3/2008 | Li | |
| 7,576,605 B2 | 8/2009 | Lee et al. | |
| 9,143,086 B2 | 9/2015 | Guthaus | |
| 9,312,769 B2* | 4/2016 | Stratakos | H02J 3/383 |
| 9,373,882 B2* | 6/2016 | McFarthing | H01Q 1/2225 |
| 9,793,788 B2* | 10/2017 | Wagoner | H02M 3/158 |
| 9,806,523 B2* | 10/2017 | Stratakos | H02J 1/102 |
| 9,843,260 B1* | 12/2017 | Paek | H02M 3/158 |
| 9,843,344 B2* | 12/2017 | Mizokami | H04B 1/04 |
| 9,928,948 B2* | 3/2018 | Naaman | H03K 17/92 |
| 9,985,520 B2* | 5/2018 | Zarkhin | H02M 3/156 |
| 2011/0129037 A1 | 6/2011 | Staszewski et al. | |

OTHER PUBLICATIONS

Pantic, et al., "A new tri-state-boost-based pickup topology for inductive power transfer", In Proceedings of IEEE Energy Conversion Congress and Exposition, Sep. 17, 2011, pp. 3495-3502.

* cited by examiner

ENHANCED RESONANT CIRCUIT AMPLIFIER

CROSS REFERENCE TO RELATED APPLICATION

This patent application claims the benefit of U.S. Provisional Patent Application Ser. No. 62/438,968 filed Dec. 23, 2016, entitled "Enhanced Resonant Circuit Amplifier," which is hereby incorporated in its entirety by reference.

BACKGROUND

A Class-C amplifier drives a resonant circuit by adding a burst of energy once every cycle. This design sometimes produces distortion in the resonant energy, which may be undesirable in some situations. In addition, some Class-C amplifiers designs have issues with symmetry when it comes to the output waveform. These issues can limit the capabilities of other circuitry utilizing the output of a Class-C amplifier, particularly when a high level of accuracy is needed.

In addition to the above-described issues, some amplifier designs utilize a capacitor to couple a drive component to the resonant circuit. Using a capacitor in this manner is problematic because the current flows the same direction with every energy burst. This can charge the coupling capacitor and eventually prevent the injection of energy into the resonant circuit.

The disclosure made herein is presented with respect to these and other considerations.

SUMMARY

Techniques for providing an enhanced resonant circuit amplifier are described herein. In some configurations, the techniques disclosed herein provide a mechanism to add a burst of energy once every half cycle of a predetermined frequency. One benefit of this technique includes reduced distortion in the resonant energy. A second benefit of this technique is the ability to "push in" and "pull out" energy from the resonant circuit. This second benefit allows the system to drive the resonant circuit through a coupling capacitor or an inductor because the net current flow is zero. As summarized above, using a capacitor to couple the drive to the resonant circuit with a conventional Class-C amplifier is problematic because the current flows the same direction with every energy burst, which causes the coupling capacitor to charge up and stop injecting energy into the resonant circuit. Conversely, by use of the techniques disclosed herein, a "push in" and "pull out" method can prevent the capacitor from charging up and allow a resonant circuit amplifier to continually produce a symmetric, stable output. As will also be described below, the techniques disclosed herein enable a controller to dynamically modify a number of aspects of an output, e.g., an amplitude of an output signal or a DC bias of an output signal, by modifying the duty cycle of an input signal.

It should be appreciated that the above-described subject matter may also be implemented as part of an apparatus, system, or as part of an article of manufacture. These and various other features will be apparent from a reading of the following Detailed Description and a review of the associated drawings.

This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The Detailed Description is described with reference to the accompanying figures. References made to individual items of a plurality of items can use a reference number with a letter of a sequence of letters to refer to each individual item. Generic references to the items may use the specific reference number without the sequence of letters.

DETAILED DESCRIPTION

In the following detailed description, reference is made to the accompanied drawings, which form a part hereof, and which is shown by way of illustration, specific example configurations of which the concepts can be practiced. These configurations are described in sufficient detail to enable those skilled in the art to practice the techniques disclosed herein, and it is to be understood that other configurations can be utilized, and other changes may be made, without departing from the spirit or scope of the presented concepts. The following detailed description is, therefore, not to be taken in a limiting sense, and the scope of the presented concepts is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means a direct electrical connection between the items connected, or an indirect connection through one or more passive or active intermediary devices and/or components. The terms "circuit" and "component" means either a single component or a multiplicity of components, either active and/or passive, that are coupled to provide a desired function. The term "signal" means at least a wattage, current, voltage, or data signal. The terms, "gate," "drain," and "source," can also mean a "base," "collector" and "emitter," and/or equivalent parts.

Figure 1:
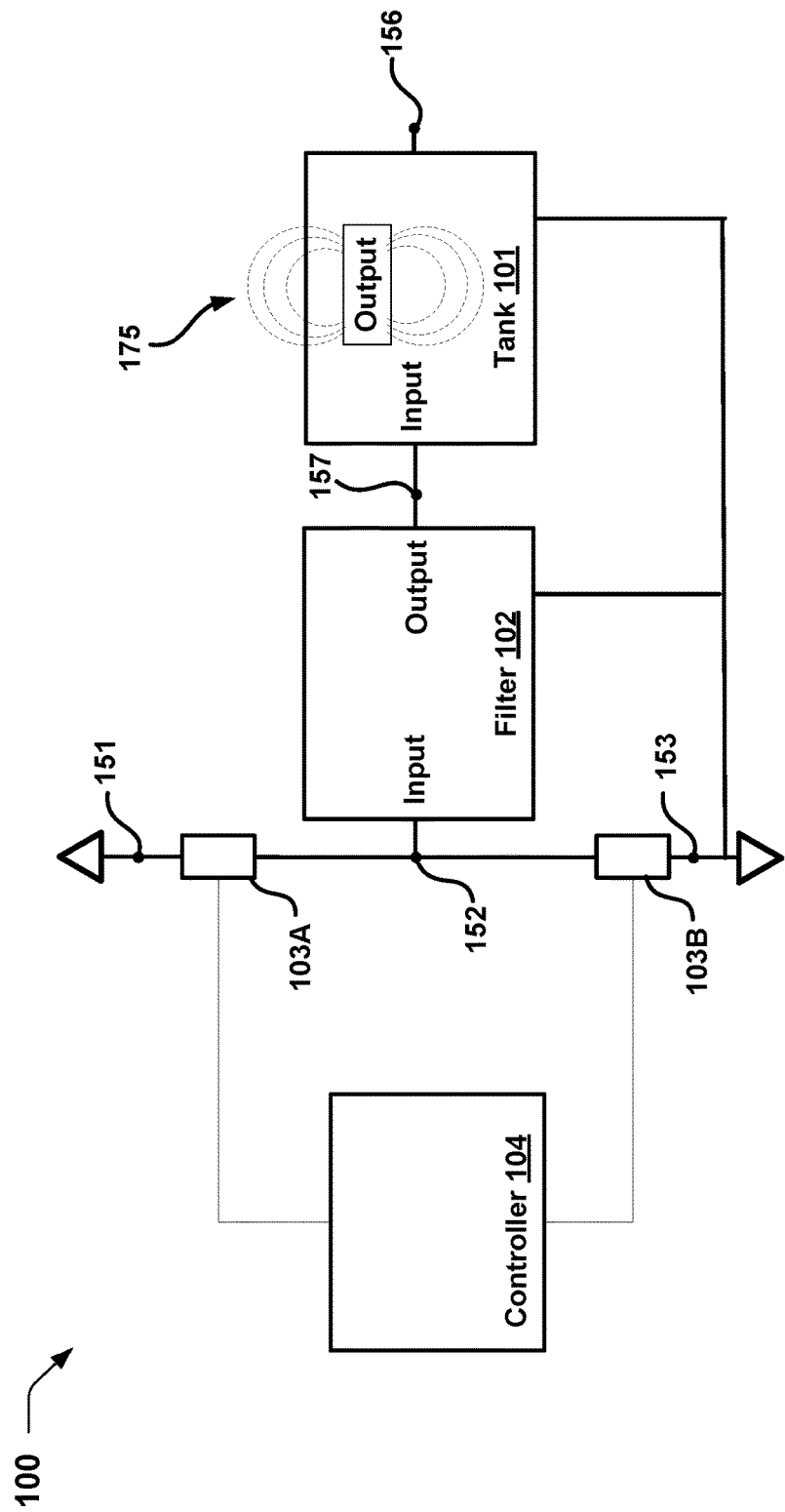
FIG. 1 shows a schematic diagram of an enhanced resonant circuit amplifier having two switches, a filter and a tank.

FIG. 1 shows a schematic diagram of an enhanced resonant circuit amplifier 100, also referred to herein as the "circuit 100" or a "system 100." As shown, the system 100 includes a tank 101, a filter 102, a first switch 103A, a second switch 103B, and a controller 104.

The tank 101, which is also referred to herein as a "resonant circuit 101," can include an input, at node 157, and an output, at node 156. The tank 101 can include any suitable circuitry for resonating an input signal at a predetermined frequency to generate an amplified output signal. The output of the tank 101 can include a current across a component, a voltage at the output node 156, or a magnetic field 175 emitting from a component of the tank 101.

The filter 102 can include an input, at node 152, and an output, at node 157. As shown, the output of the filter 102 is coupled to the input of the tank 101. The filter 102 can be configured to reduce harmonic frequencies above the predetermined frequency described above. The filter 102 can also be configured to filter frequencies above or below other desirable cutoff levels.

The first switch 103A is configured to couple a first source (node 151) at a first voltage to the input of the filter 102. For illustrative purposes, the first switch 103A provides a closed circuit, or a low impedance path, between the first source and the input of the filter 102 when an input of the first switch 103A is activated. The first switch 103A provides an open circuit, or otherwise a high impedance path, between the first source and the input of the filter 102 when the input of the first switch 103A is deactivated (not activated).

The second switch 103B is configured to couple a second source (node 153) at a second voltage to the input of the filter 102. For illustrative purposes, the second switch 103B provides a closed circuit, or a low impedance path, between the second source and the input of the filter 102 when an input of the second switch 103B is activated. The second switch 103B provides an open circuit, or otherwise a high impedance path, between the second source and the input of the filter 102 when the input of the second switch 103B is deactivated (not activated). For illustrative purposes, the first source at node 151 is also referred to herein as a "first voltage source" and the second source at node 153 is also referred to herein as a "second voltage source."

The controller 104 can include any circuitry or computing device suitable for generating control signals that alternate the activation of the control signals that are applied to the input of the first switch 103A and the input of the second switch 103B at a predetermined frequency. In some configurations, with respect to a cycle of the predetermined frequency, the first switch can be activated at the beginning of the cycle and the second switch is activated at a middle of the cycle (at 180 degrees). The activation period, which is referred to herein as a duty cycle, for each control signal can have duty cycle that is less than 50% of the cycle. In some configurations, the duty cycle of each control signal can be within a range of 2% and 20% of a cycle. In one example, the first switch can be 2 to 20% of the cycle and the second switch can be 2 to 20% of the cycle, depending on the power level. Such values of the duty cycle can provide optimal power efficiency. These examples are provided for illustrative purposes and are not to be construed as limiting.

As will be described in more detail below, the alternating activation of the first switch and the second switch produces a signal (referred to herein as an "intermediate signal") at the output of the filter 102, which is fed into the input of the resonant circuit 101. The intermediate signal causes the resonant circuit 101 to resonate at the predetermined frequency thereby causing a generation of the amplified output signal at the predetermined frequency.

Figure 2:
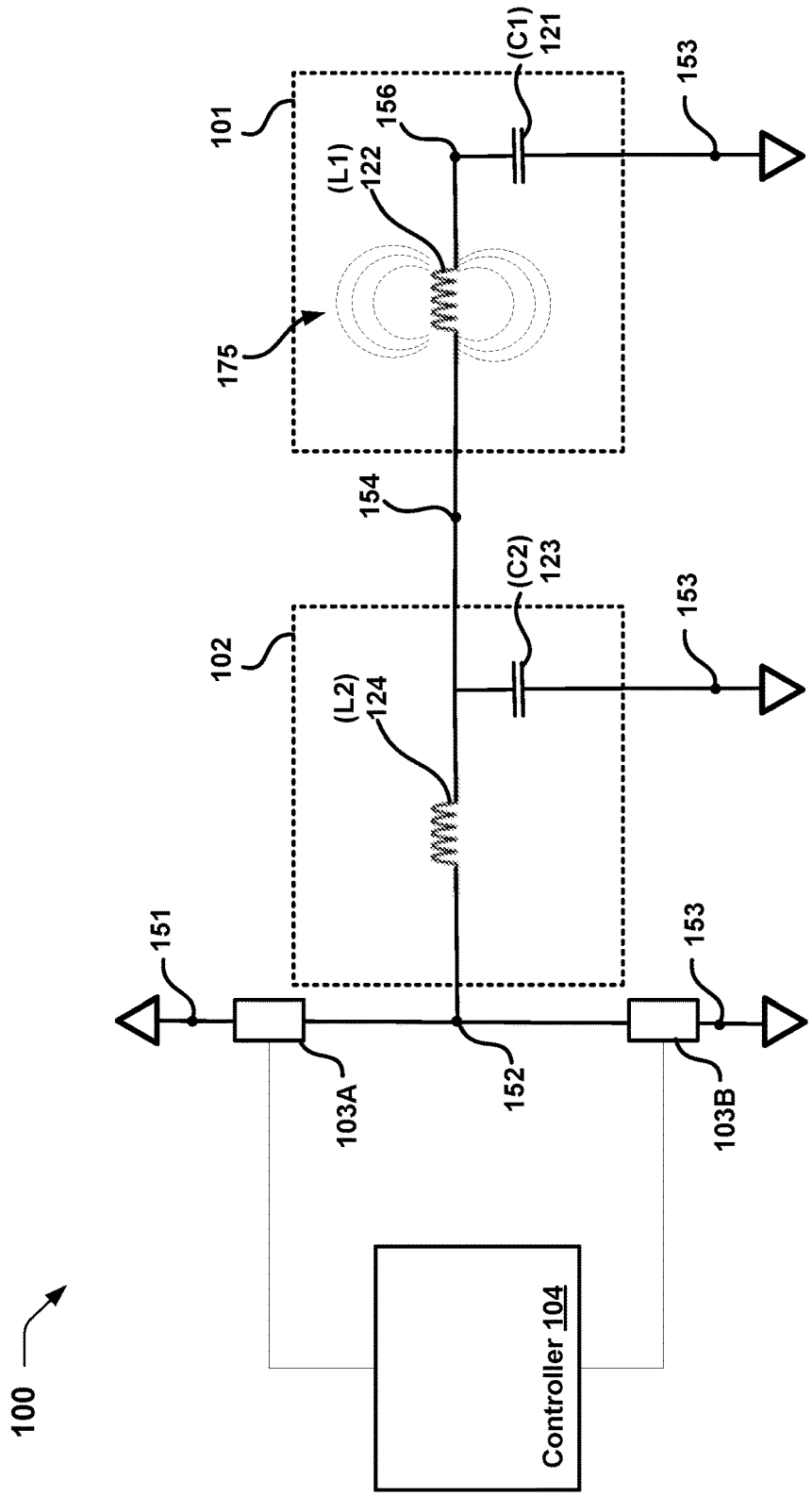
FIG. 2 shows a schematic diagram illustrating details of the filter and tank shown in FIG. 1.

FIG. 2 shows a schematic diagram illustrating details of the filter 102 and tank 101 shown in FIG. 1. In some configurations, the tank 101 comprises a capacitor (C1) 121 and an inductor (L1) 122 having capacitance and inductance values for causing resonation of the intermediate signal, or any suitable input signal fed into the input of the tank 101, to generate the amplified output signal at the predetermined frequency.

The capacitor (C1) 121 and the inductor (L1) 122 can be in any suitable configuration. For example, the capacitor (C1) 121 and the inductor (L1) 122 can be coupled in series, wherein a first terminal of the inductor (L1) 122 functions as the input of the tank 101, and wherein a second terminal of the inductor (L1) 122 is coupled to an output node 156. In such configurations, a first terminal of the capacitor (C1) 121 is coupled to the output node 156, and a second terminal of the capacitor (C1) 121 is coupled to the second source (node 153).

Figure 7:
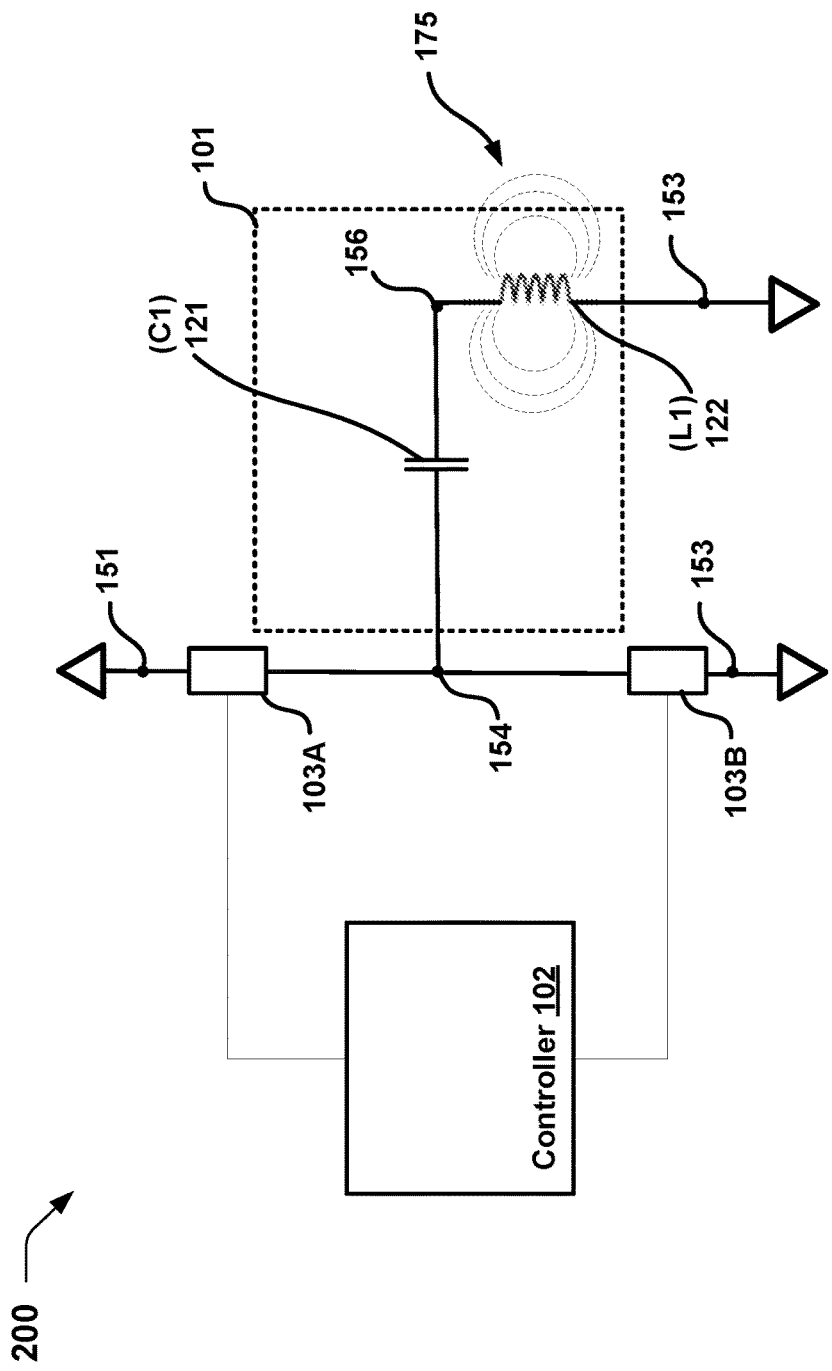
FIG. 7 shows a schematic diagram illustrating details of another configuration of the tank shown in FIG. 5.

In another example, with reference to FIG. 7, the capacitor (C1) 121 and the inductor (L1) 122 can be coupled in series, wherein a first terminal of the capacitor (C1) 121 functions as the input of the tank 101, and wherein a second terminal of the capacitor (C1) 121 is coupled to an output node 156. In such configurations, a first terminal of the inductor (L1) 122 is coupled to the output node 156, and a second terminal of the inductor (L1) 122 is coupled to the second source (node 153).

For illustrative purposes, the capacitor (C1) 121 and the inductor (L1) 122 can respectively have values of 3000 picofarads and 0.6 millihenries for enabling the tank 101 to resonate at a predetermined frequency of 120 KHz. In such an example, the voltage of the first source (node 151) can be approximately 5 Volts and the voltage of the second source (node 153) can be zero Volts, e.g., a ground node. Such an arrangement can create an amplified output signal of approximately 50 volts. This example is provided for illustrative purposes and is not to be construed as limiting.

As summarized above, the filter 102 can comprise any circuitry for filtering frequencies above the predetermined frequency, and, in some configurations, below the predetermined frequency. For example, the capacitor (C2) 123 and the inductor (L2) 124 can be coupled in series, wherein a first terminal of the inductor (L2) 124 functions as the input of the filter 102, and wherein a second terminal of the inductor (L1) 122 is coupled to an output of the filter 102, node 154. In such configurations, a first terminal of the capacitor (C2) 123 is coupled to the output of the filter 102, node 154. In addition, a second terminal of the capacitor (C2) 123 is coupled to the second source (node 153).

For illustrative purposes, the capacitor (C2) 123 and the inductor (L2) 124 of the filter 102 can respectively have values of 0.01 microfarads and 22 microhenries for enabling the filter 102 frequencies above a cutoff frequency of 0.34 MHz, which can reduce harmonic frequencies above the example predetermined frequency. This example is provided for illustrative purposes and is not to be construed as limiting. Other components having other values suitable for other applications can be used. In addition other filter designs can be used.

Figure 3:
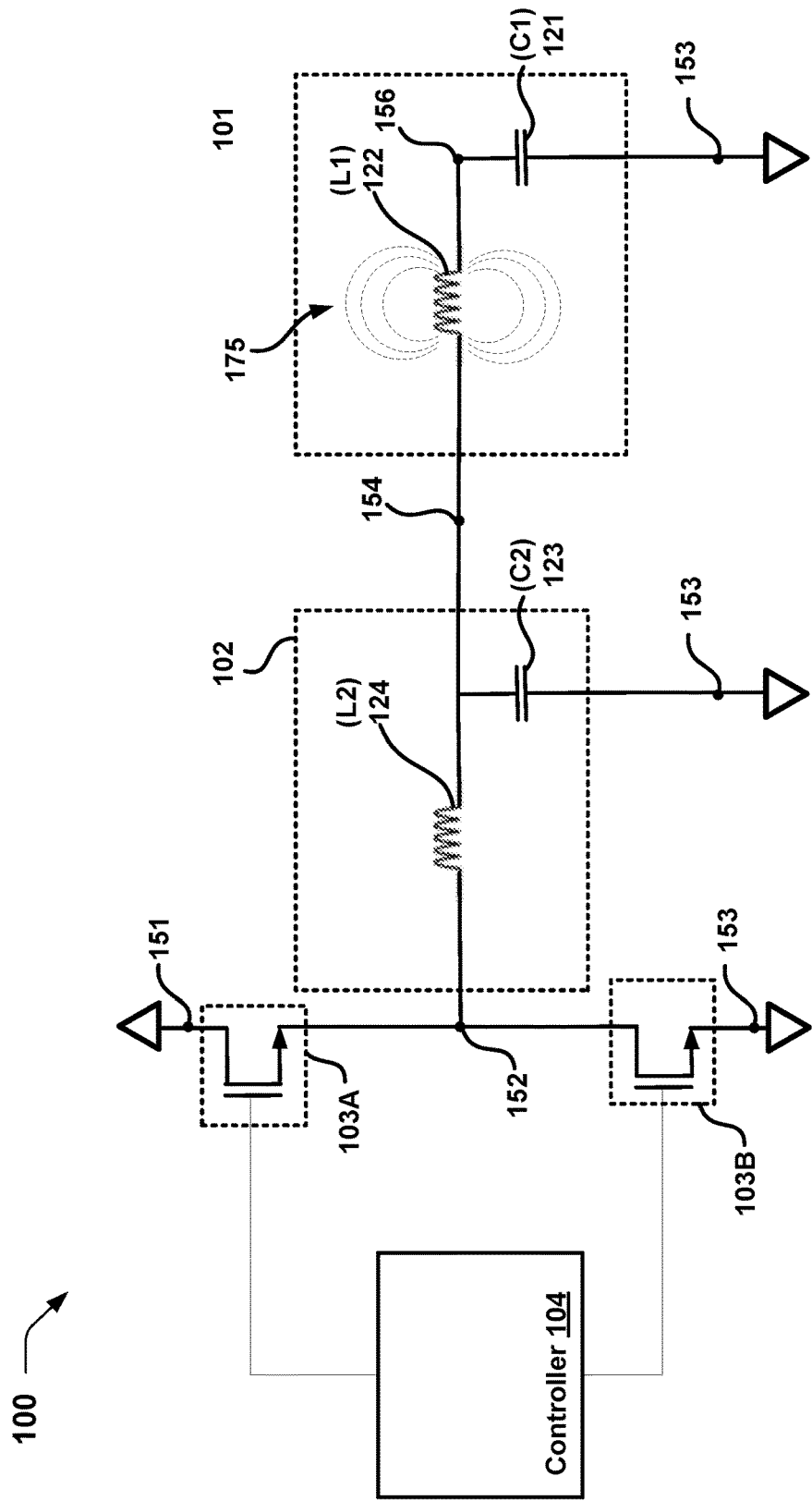
FIG. 3 shows a schematic diagram illustrating details of the switches shown in FIG. 1.

FIG. 3 shows a schematic diagram illustrating details of the first switch 103A and the second switch 103B, which are individually and collectively referred to herein as "switches 103." As shown, the switches 103 can comprise a transistor, such as a field-effect transistor (FET), or any other component for causing a low impedance path or a high impedance path between two nodes. In the example shown in FIG. 3, the first switch 103A comprises a transistor having a drain coupled to the first voltage source (node 151), a gate coupled to a first output of the controller 104, and a source coupled to the input of the filter 102 (node 152). Also shown, the second switch 103B comprises a transistor having a drain coupled to the input of the filter 102 (node 152), a gate coupled to a second output of the controller 104, and a source coupled to the second voltage source (node 153). It can be appreciated that other components and/or arrangements can be used to achieved the techniques described herein as these examples are provided for illustrative purposes.

Figure 4A:
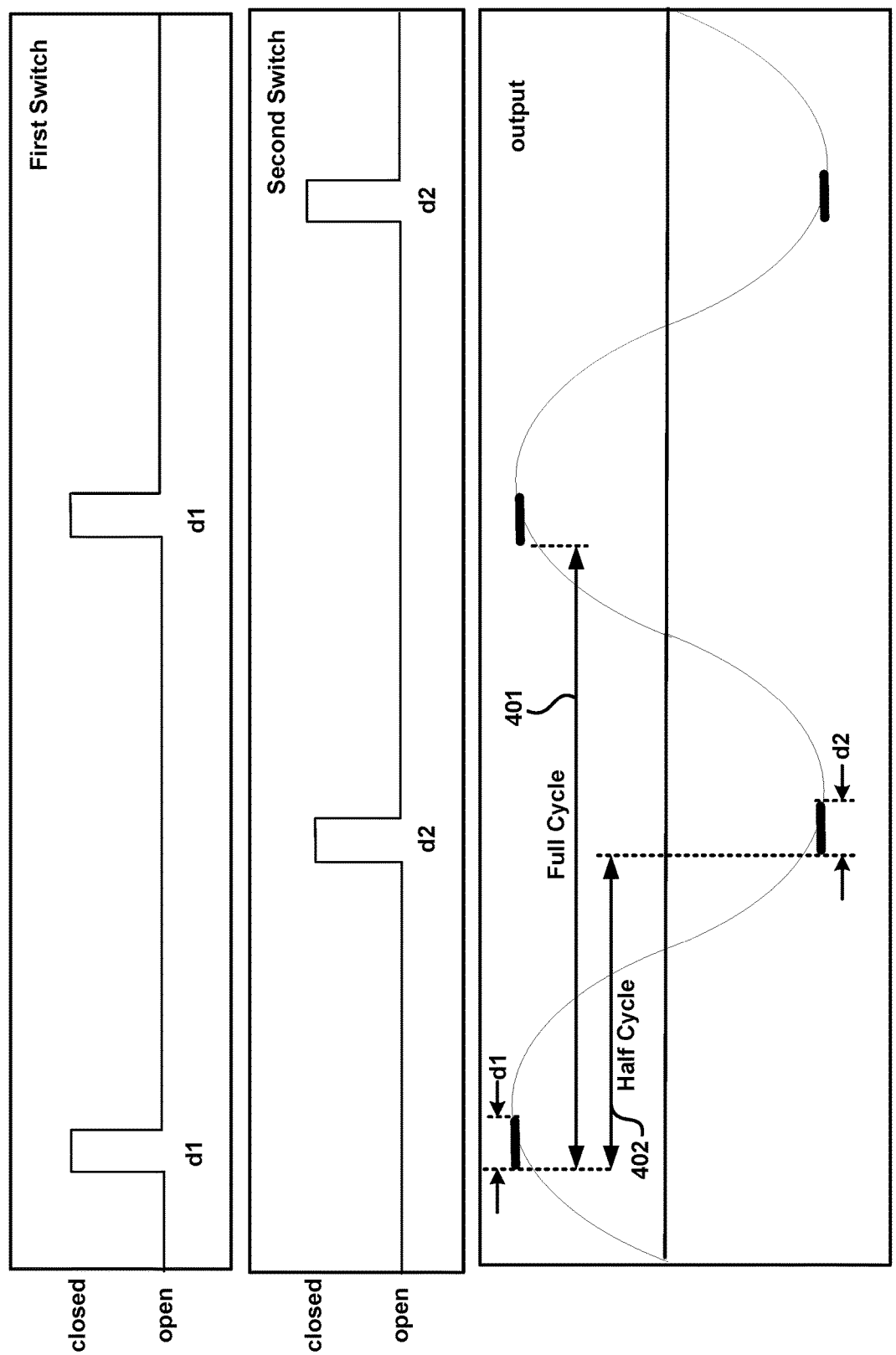
FIGS. 4A-4C show illustrations of an output signal and input signals caused by the switches.
Figure 4B:
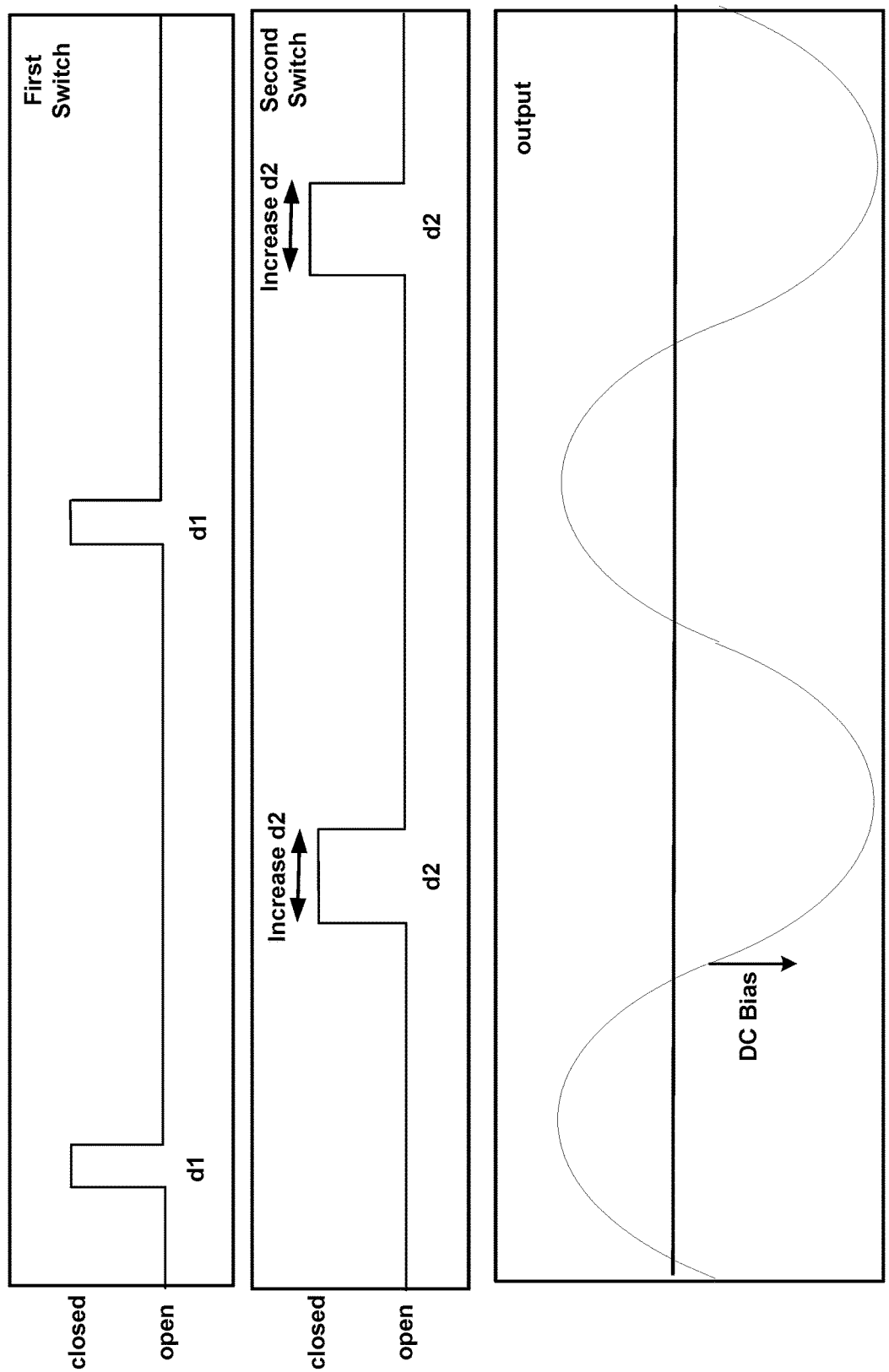
Figure 4C:
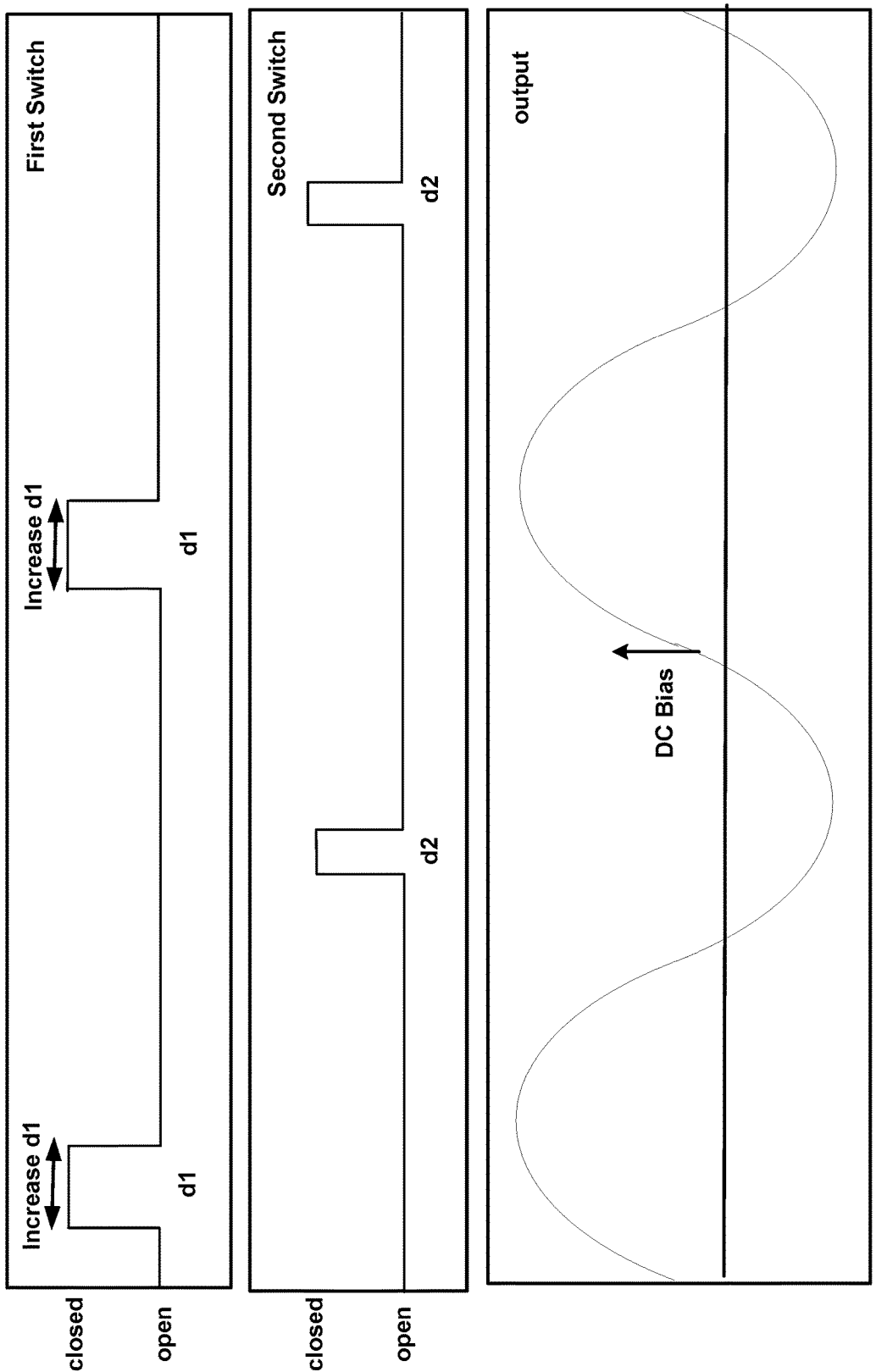

FIGS. 4A-4C show illustrations of an output signal and signals caused by the switches. As summarized above, the controller 104 can alternate the activation of the control signals that are applied to the input of the first switch and the input of the second switch at a predetermined frequency. In FIGS. 4A-4C, the first (top diagram) diagram shows the control signal generated by the first switch 103A, the second diagram (middle diagram) shows the control signal generated by the second switch 103B, and the third diagram (bottom diagram) illustrates an output signal of the tank 101. For illustrative purposes, when a switch is activated, the switch is "closed" or having a low impedance path. When a switch is not activated, the switch is "open" or having a high impedance path. The first switch 103A can produce an input signal (at node 152) having a duty cycle (d1), and the second switch 103B can produce an input signal (at node 152) having a duty cycle (d2). In some configurations, the duty cycle can be less than half of the cycle of the predetermined frequency. As shown, the duty cycle associated with the output of each switch 103 can be significantly shorter than half of the cycle of the predetermined frequency.

The bottom diagram of FIG. 4A shows an overlay of the input signals (at node 152) relative to the output signal of the tank 101. As shown, when the first switch 103A is activated (closed), it causes a high voltage at the input of the filter 102, which causes the output voltage to rise, and when the second switch 103B is activated (closed), it causes a low voltage at the input of the filter 102, which causes the output voltage to decrease. This is referred to herein as "pushing" and "pulling" the output signal, a feature that enables the creation of a symmetric output waveform. As also shown, the output of the tank 101 is slightly delayed in comparison to the cycle of the input signals (at node 152). As also shown, in some configurations, the controller 104 causes the duty cycle (d1) of the control signal for activating the first switch 103A to be equal to the duty cycle (d2) of the control signal for activating the second switch 103B.

In some configurations, the techniques disclosed herein enable the controller 104 to change the DC bias of an output signal. More specifically, the controller 104 can lengthen or shorten the control signal applied to at least one switch 103 to change the DC bias of the output signal.

FIG. 4B shows one example where the DC bias of the output signal is lowered by increasing the duty cycle (d2) of the control signal activating the second switch 103B. The DC bias of the output signal can also be lowered by decreasing the duty cycle (d1) of the control signal activating the first switch 103A. In general, the controller 104 can cause the duty cycle (d1) of the control signal for activating the first switch 103A to be less than the duty cycle (d2) of the control signal for activating the second switch 103B thereby causing a DC voltage of the output node 156 to bias toward the second voltage of the second source.

FIG. 4C shows one example where the DC bias of the output signal is raised by increasing the duty cycle (d1) of the control signal activating the first switch 103A. The DC bias of the output signal can also be raised by decreasing the duty cycle (d2) of the control signal activating the second switch 103B. In general, the controller 104 can cause the duty cycle (d1) of the control signal for activating the first switch 103A to be greater than the duty cycle (d2) of the control signal for activating the second switch 103B thereby causing the DC voltage of the output signal, at node 156, to bias toward the first voltage of the first source.

In addition to controlling the DC bias of an output signal, the controller 104 can also modify the gain of the tank 101. For example, the controller 104 can equally increase the duty cycle (d1 and d2) of the control signals for both switches 103 to increase a gain level of the tank 101 thereby increasing an amplitude of the amplified output signal. In addition, the controller can equally decrease the duty cycle (d1 and d2) of the control signals for both switches 103 to decrease the gain level of the tank 101 thereby decreasing the amplitude of the amplified output signal.

Figure 5:
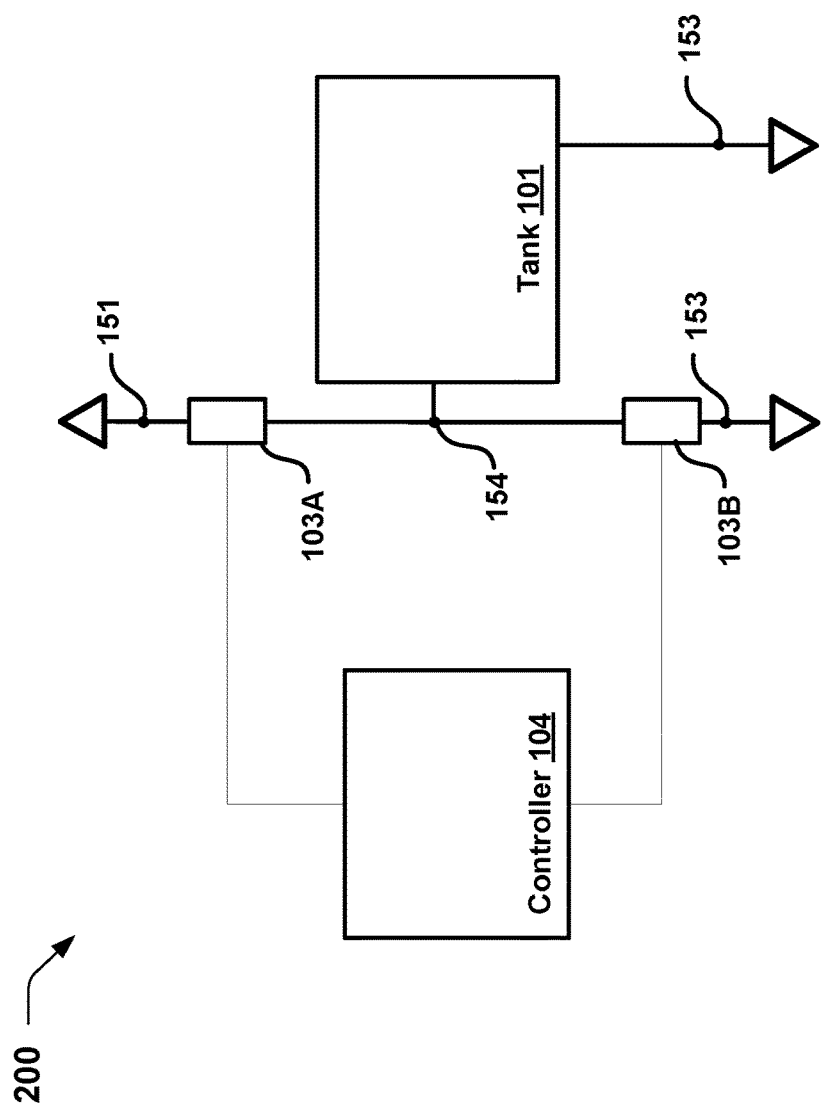
FIG. 5 shows a schematic diagram of an enhanced resonant circuit amplifier having two switches and a tank.

FIG. 5 illustrates another example of an enhanced resonant circuit amplifier 200 having a tank 101 (resonant circuit 101), a first switch 103A, a second switch 103B, and the controller 104. The enhanced resonant circuit amplifier 200 of FIG. 5 is configured in a manner similar to the tank 101 described above with respect to FIG. 1, however, the switches 103 provide an input signal directly to the tank 101.

Figure 6:
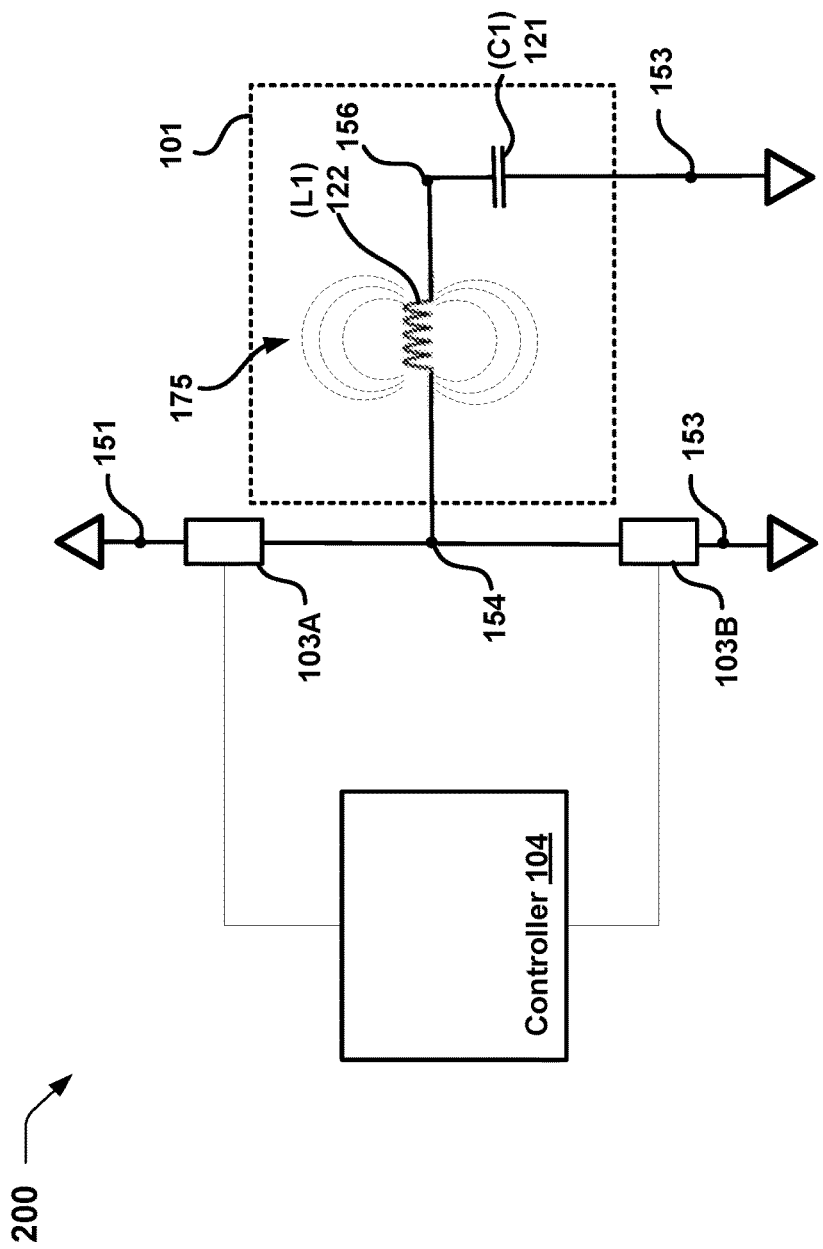
FIG. 6 shows a schematic diagram illustrating details of one configuration of the tank shown in FIG. 5.

FIG. 6 illustrates additional details of the enhanced resonant circuit amplifier 200 shown in FIG. 5. In this example, the capacitor (C1) 121 and the inductor (L1) 122 can be coupled in series, wherein a first terminal of the inductor (L1) 122 functions as the input of the tank 101, and wherein a second terminal of the inductor (L1) 122 is coupled to an output node 156. In such configurations, a first terminal of the capacitor (C1) 121 is coupled to the output node 156, and a second terminal of the capacitor (C1) 121 is coupled to the second source (node 153).

In another example, with reference to FIG. 7, the capacitor (C1) 121 and the inductor (L1) 122 can be coupled in series, wherein a first terminal of the capacitor (C1) 121 functions as the input of the tank 101, and wherein a second terminal of the capacitor (C1) 121 is coupled to an output node 156. In such configurations, a first terminal of the inductor (L1) 122 is coupled to the output node 156, and a second terminal of the inductor (L1) 122 is coupled to the second source (node 153).

Figure 8:
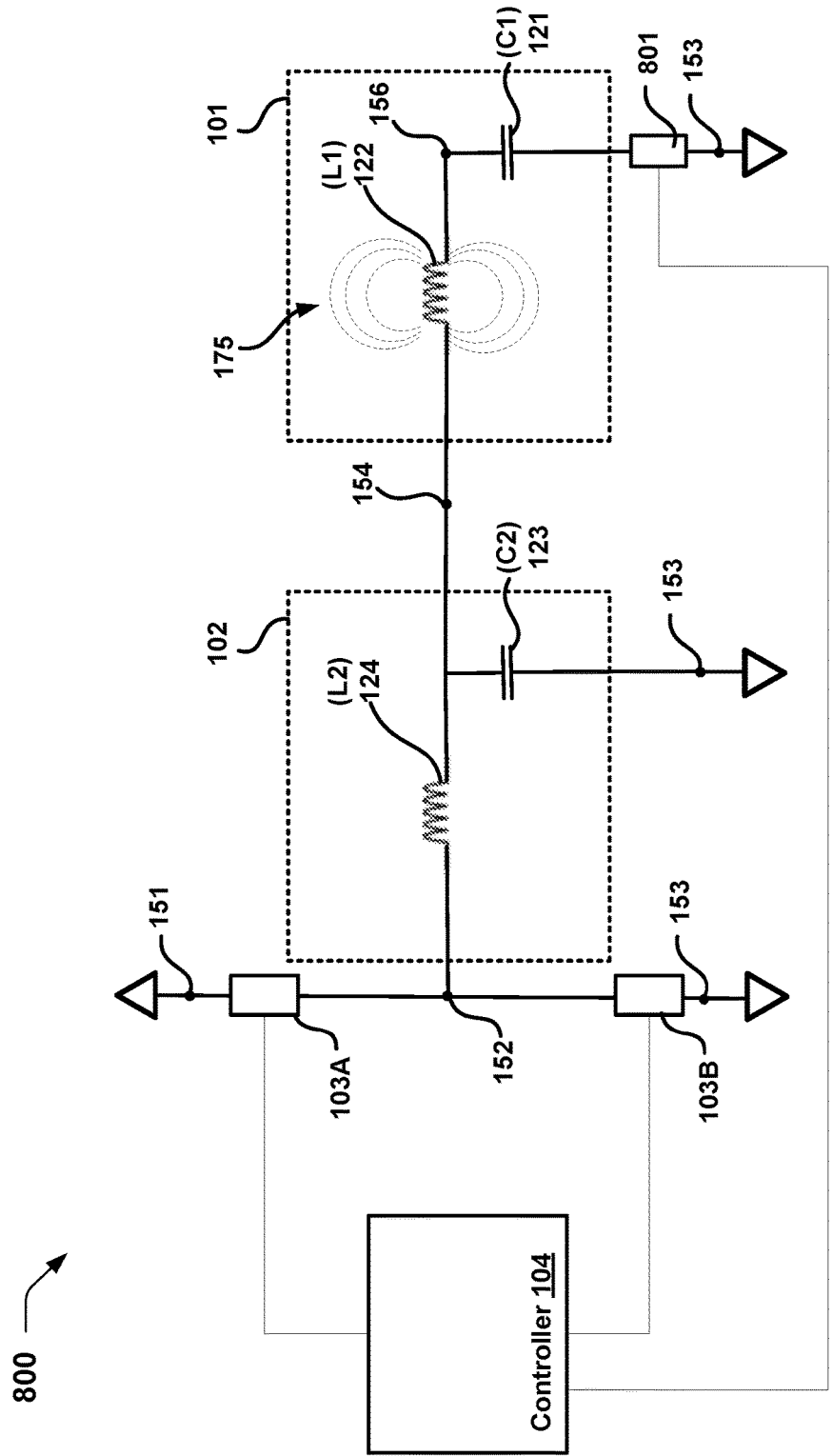
FIG. 8 shows a schematic diagram of an enhanced resonant circuit amplifier having a feedback mechanism for measuring current.

FIG. 8 shows a schematic diagram of an enhanced resonant circuit amplifier 800 having a feedback mechanism for measuring a current across a device. In such an embodiment, the circuit 800 can have a device 801, such as a resistor, coupling the capacitor (C1) 121 to the second source (node 153). The controller 104 can use measurements of current passing through the device 801 to control the gain of the tank 101. For example, a method can include receiving a feedback input signal, such as a voltage over the device 801 to measure the current produced by the tank 101. The controller 104 can determine when the current produced by the tank 101 is below a threshold. Based at least in part on determining that the current is below the threshold, the controller 104 can increase the duty cycle of the control signals to increase the current, or otherwise increase the gain of the resonant circuit 101.

The controller 104 can also determine when the current produced by the tank 101 is above a threshold. Based at least in part on determining that the current is above the threshold, the controller 104 can decrease the duty cycle of the control signals to decrease the current, or otherwise decrease the gain of the resonant circuit 101.

Figure 9:
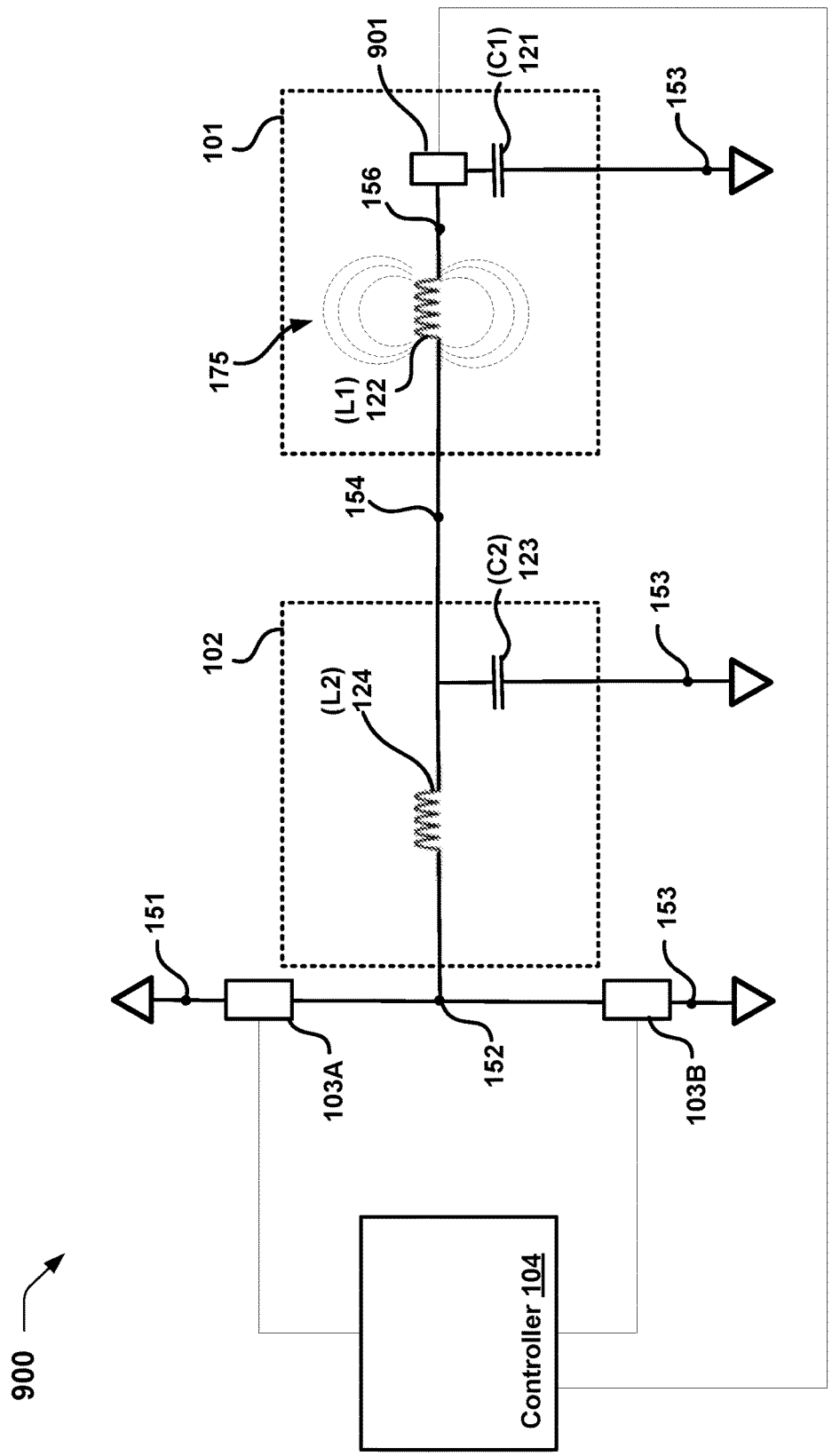
FIG. 9 shows a schematic diagram of an enhanced resonant circuit amplifier having a feedback mechanism for measuring a voltage.

FIG. 9 shows a schematic diagram of an enhanced resonant circuit amplifier having a feedback mechanism, such as a sensor 901, for measuring a voltage. In this configuration, via the sensor 901, the controller 104 can measure the DC voltage of the output node 156. If the DC voltage of the output is above a threshold, the controller 104 can cause the duty cycle of the control signal applied to the second switch 103B to be longer than the duty cycle of the control signal applied to the first switch 103A. As described above with respect to FIG. 4B, such an adjustment to one or more duty cycles can lower the DC bias of an output signal.

In addition, if the DC voltage of the output is above a threshold, the controller 104 can cause the duty cycle of the control signal applied to the second switch 103B to be longer than the duty cycle of the control signal applied to the first switch 103A. As described above with respect to FIG. 4B, such an adjustment to one or more duty cycles can lower the DC bias of an output signal.

Figure 10:
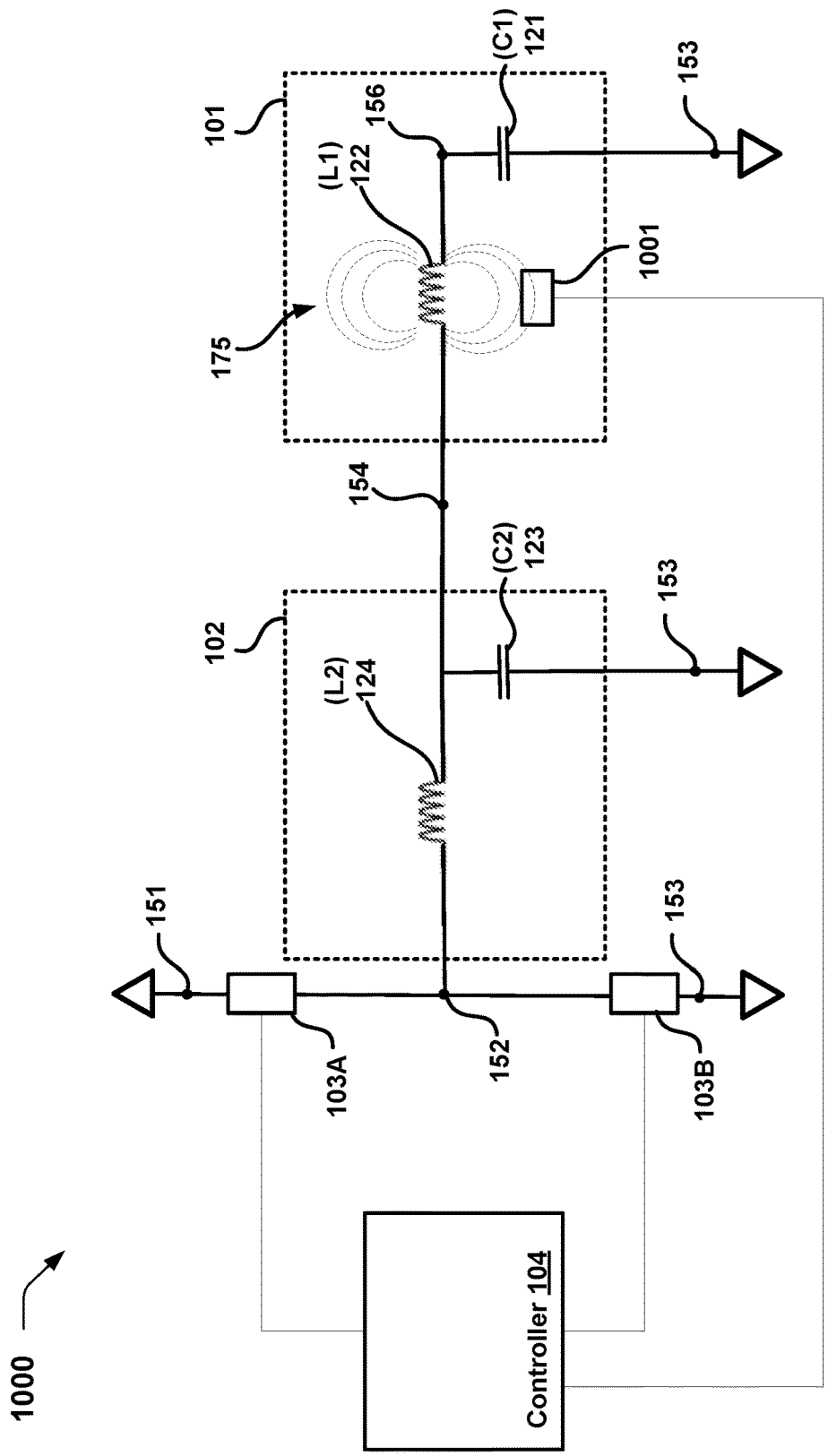
FIG. 10 shows a schematic diagram of an enhanced resonant circuit amplifier having a feedback mechanism for measuring a magnetic field.

FIG. 10 shows a schematic diagram of an enhanced resonant circuit amplifier 1000 having a device 1001, such as a field sensor, for measuring a magnetic field 175. In this configuration, the controller 104 can measure the intensity of a magnetic field 175 produced by the tank 101. Any suitable device 1001 for measuring a magnetic field 175 can be utilized. If an intensity of the magnetic field 175 produced by the tank 101 is below a threshold, the controller 104 can increase the duty cycle of the control signals to the switches 103 to increase the intensity of the magnetic field 175. If the intensity of the magnetic field 175 produced by the tank 101 is above a threshold, the controller 104 can decrease the duty cycle of the control signals to the switches 103 to decrease the intensity of the magnetic field 175.

Figure 11:
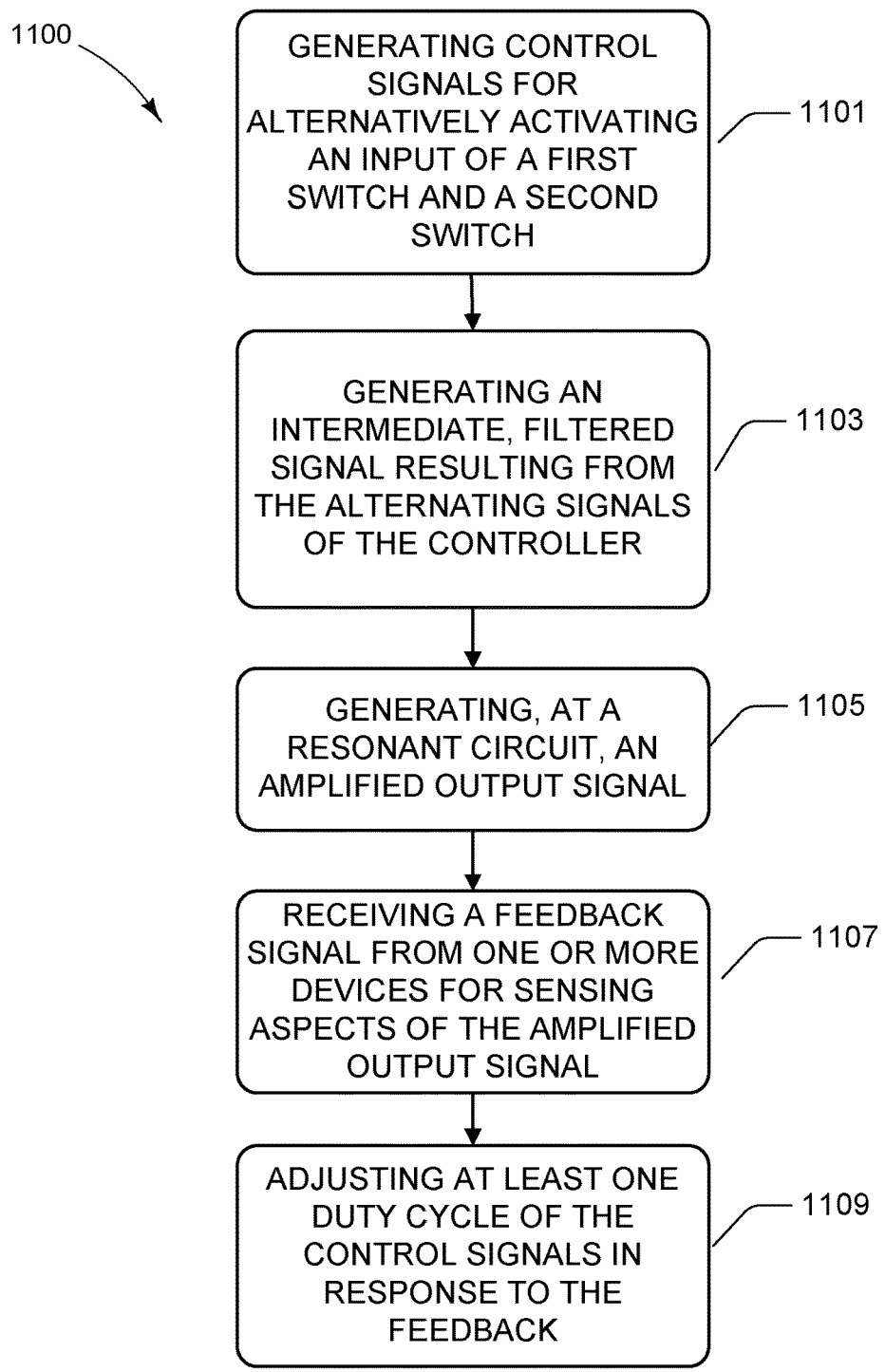
FIG. 11 illustrates a flow chart implementing an example method in accordance with techniques disclosed herein.

FIG. 11 illustrates a flow chart implementing an example method 1100 in accordance with techniques disclosed herein. Other logical flows can be implemented using the circuits described herein, as the logical flow disclosed herein is provided for illustrative purposes and is not to be construed as limiting. The logical flow described herein can be implemented by a system 100 having a tank 101, a filter 102, a first switch 103A and a second switch 103B, and a controller 104. The method 1100 can also be implement it on a system 200 having a tank 101, a first switch 103A and a second switch 103B, and a controller 104.

The logical flow starts at block 1101 where the controller 104 generates control signals for alternately activating an input of a first switch 103A and an input of a second switch at a predetermined frequency, wherein the first switch 103A is activated at the beginning of a cycle 401 and the second switch 103B is activated at a middle of the cycle 401. In some configurations, the duty cycle of the control signals are less than a half of the cycle 402 of the predetermined frequency. As summarized above, the first switch 103A couples a first source at a first voltage to an input of a filter 102 when the first switch 103A is activated, and the second switch 103B couples a second source at a second voltage to the input of the filter when the second switch 103B is activated.

Next, at block 1103, an intermediate signal having the predetermined frequency resulting from the alternating signals produced by the controller 104. The filter 102 can cause the intermediate signal to have reduced harmonic frequencies above and/or below the predetermined frequency. The filtered, intermediate signal is provided to an input of the tank 101 (resonant circuit 101).

Next, at block 1105, an amplified output signal is generated at the tank 101 (resonant circuit 101). As summarized above, an input signal provided to the tank 101, such as the intermediate signal, causes the resonant circuit 101 to resonate at the predetermined frequency thereby producing the amplified output signal at the predetermined frequency.

Next, at block 1107, the controller 104 receives a feedback signal from one or more devices sensing aspects of the amplified output signal. The one or more devices can include a voltage sensor, circuitry for measuring current, or circuitry for measuring a magnetic field.

Next, at block 1109, the feedback signal received at the controller 104 can be utilized to adjust at least one duty cycle of the control signals. In some configurations, the duty cycle of the control signals can be increased to increase the gain of the tank 101, the duty cycle of the control signals can be decreased to decrease the gain of the tank 101. In one configuration, the controller 104 can receive a feedback input signal from a device, such as device 901 of FIG. 9, measuring a DC voltage of the amplified output signal. The controller can then adjust the duty cycle of a control signal at the input of either the first switch or the second switch to adjust the DC voltage of the amplified output signal.

It should be understood that the operations of the methods disclosed herein are not necessarily presented in any particular order and that performance of some or all of the operations in an alternative order(s) is possible and is contemplated. The operations have been presented in the demonstrated order for ease of description and illustration. Operations may be added, omitted, and/or performed simultaneously, without departing from the scope of the appended claims. It also should be understood that the illustrated methods can be ended at any time and need not be performed in its entirety.

The above specification, examples and data provide a complete description of the manufacture and use of the composition of the invention. Since many embodiments of the invention can be made without departing from the spirit and scope of the invention, the invention resides in the claims hereinafter appended.

CONCLUSION

In closing, although the various configurations have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A system, comprising:
a resonant circuit comprising an input and an output, the resonant circuit generating an amplified output signal at a predetermined frequency in response to receiving an intermediate signal received at the input of the resonant circuit, wherein the resonant circuit generates the amplified output signal by amplifying the intermediate signal;

a filter comprising an input and an output, wherein the output of the filter is coupled to the input of the resonant circuit, wherein the filter reduces harmonic frequencies above the predetermined frequency from an input signal received at the input of the filter, the output of the filter producing the intermediate signal at the predetermined frequency and having reduced harmonic frequencies above the predetermined frequency;

a first switch coupling a first source at a first voltage to the input of the filter when an input of the first switch is activated;

a second switch coupling a second source at a second voltage to the input of the filter when an input of the second switch is activated; and a controller generating control signals to alternately activate the input of the first switch and the input of the second switch at the predetermined frequency associated with a cycle, where the first switch is activated at the beginning of the cycle and the second switch is activated at a middle of the cycle, wherein a duty cycle of the control signals are less than a half of the cycle, wherein an alternating activation of the first switch and the second switch at the predetermined frequency produces the intermediate signal having the predetermined frequency, the intermediate signal causing the resonant circuit to resonate at the predetermined frequency thereby causing a generation of the amplified output signal at the predetermined frequency, wherein the controller causes a duty cycle (d1) of a control signal for activating the first switch to be equal to a duty cycle (d2) of a control signal for activating the second switch.

2. The system of claim 1, wherein the resonant circuit comprises a capacitor (C1) and an inductor (L1) having capacitance and inductance values for causing resonation of the intermediate signal to generate the amplified output signal at the predetermined frequency.

3. The system of claim 2, wherein the capacitor and the inductor are coupled in series, wherein a first terminal of the inductor (L1) functions as the input of the resonant circuit, wherein a second terminal of the inductor (L1) is coupled to an output node, wherein a first terminal of the capacitor (C1) is coupled to the output node, and wherein a second terminal of the capacitor (C1) is coupled to the second source.

4. The system of claim 2, wherein the capacitor and the inductor are coupled in series, wherein a first terminal of the capacitor (C1) functions as the input of the resonant circuit, wherein a second terminal of the capacitor (C1) is coupled to an output node, wherein a first terminal of the inductor (L1) is coupled to the output node, and wherein a second terminal of the inductor (L1) is coupled to the second source.

5. The system of claim 2, wherein the intermediate signal causes the inductor (L1) to generate a magnetic field oscillating at the at the predetermined frequency.

6. The system of claim 3, wherein the controller modifies the duty cycle (d1) of the control signal for activating the first switch to be greater than the duty cycle (d2) of the control signal for activating the second switch causing a DC voltage of the output node to bias toward the first voltage of the first source.

7. The system of claim 3, wherein the controller modifies the duty cycle (d1) of the control signal for activating the first switch to be less than the duty cycle (d2) of the control signal for activating the second switch causing a DC voltage of the output node to bias toward the second voltage of the second source.

8. The system of claim 1, wherein the controller increases the duty cycle (d1 and d2) of the control signals to increase a gain level of the resonant circuit thereby increasing an amplitude of the amplified output signal, wherein the controller decreases the duty cycle (d1 and d2) of the control signals to decrease the gain level of the resonant circuit thereby decreasing the amplitude of the amplified output signal.

9. A method for generating an amplified output signal at a predetermined frequency, wherein the method comprises:

generating, at a controller, control signals for alternately activating an input of a first switch and an input of a second switch at the predetermined frequency, wherein the first switch is activated at the beginning of a cycle and the second switch is activated at a middle of the cycle, wherein a duty cycle of the control signals are less than a half of the cycle, wherein the first switch couples a first source at a first voltage to an input of a filter when the first switch is activated wherein the second switch couples a second source at a second voltage to the input of the filter when the second switch is activated;

generating, at the filter, an intermediate signal having the predetermined frequency resulting from the alternately activating of the controller, the intermediate signal having reduced harmonic frequencies above the predetermined frequency, wherein the intermediate signal is provided to an input of a resonant circuit; and generating, at the resonant circuit, the amplified output signal at the predetermined frequency, wherein the intermediate signal causes the resonant circuit to resonate at the predetermined frequency thereby producing the amplified output signal at the predetermined frequency.

10. The method of claim 9, further comprising:
receiving, at the controller, a feedback input signal from a device measuring an amplitude of the amplified output signal;
determining, at the controller, that the amplitude is below a threshold; and
based at least in part on determining that the amplitude is below the threshold, increasing the duty cycle of the control signals to increase the amplitude of the amplified output signal.

11. The method of claim 9, further comprising:
receiving, at the controller, a feedback input signal from a device measuring an amplitude of the amplified output signal;
determining, at the controller, that the amplitude is above a threshold; and
based at least in part on determining that the amplitude is above the threshold, decreasing the duty cycle of the control signals to decrease the amplitude of the amplified output signal.

12. The method of claim 9, further comprising:
receiving, at the controller, a feedback input signal from a device measuring a current of the amplified output signal;
determining, at the controller, that the current is below a threshold; and
based at least in part on determining that the current is below the threshold, increasing the duty cycle of the control signals to increase the current.

13. The method of claim 9, further comprising:
receiving, at the controller, a feedback input signal from a device measuring a current of the amplified output signal;
determining, at the controller, that the current is above a threshold; and based at least in part on determining that the current is above the threshold, decreasing the duty cycle of the control signals to decrease the current.

14. The method of claim 9, further comprising:
receiving, at the controller, a feedback input signal from a device measuring a magnetic field of the resonant circuit;
determining, at the controller, that an intensity of the magnetic field is below a threshold; and
based at least in part on determining that the intensity of the magnetic field is below the threshold, increasing the duty cycle of the control signals to increase the intensity of the magnetic field.

15. The method of claim 9, further comprising:
receiving, at the controller, a feedback input signal from a device measuring a magnetic field of the resonant circuit;
determining, at the controller, that an intensity of the magnetic field is above a threshold; and
based at least in part on determining that the intensity of the magnetic field is above the threshold, decreasing the duty cycle of the control signals to decrease the intensity of the magnetic field.

16. The method of claim 9, further comprising:
receiving, at the controller, a feedback input signal from a device measuring a DC voltage of the amplified output signal; and
adjusting the duty cycle of the control signal at the input of either the first switch or the second switch to adjust the DC voltage of the amplified output signal.

17. A system for generating an amplified output, comprising:
a resonant circuit comprising an input and an output, wherein the resonant circuit comprises a capacitor (C1) and an inductor (L1) having a capacitance value and an inductance value for causing resonation of the amplified output signal at the predetermined frequency;
a first switch coupling a first source at a first voltage to the input of the resonant circuit when an input of the first switch is activated;
a second switch coupling a second source at a second voltage to the input of the resonant circuit when an input of the second switch is activated; and
a controller for generating control signals to alternately activate the input of the first switch and the input of the second switch at a predetermined frequency associated with a cycle, where the first switch is activated at the beginning of the cycle and the second switch is activated at a middle of the cycle, wherein a duty cycle of the control signals are less than a half of the cycle, wherein an alternating activation of the first switch and the second switch causes the resonant circuit to resonate at the predetermined frequency thereby causing a generation of the amplified output signal at the predetermined frequency, wherein the controller causes a duty cycle (d1) of a control signal for activating the first switch to be equal to a duty cycle (d2) of a control signal for activating the second switch.

18. The system of claim 17, wherein the capacitor and the inductor are coupled in series, wherein a first terminal of the inductor (L1) functions as the input of the resonant circuit, wherein a second terminal of the inductor (L1) is coupled to an output node, wherein a first terminal of the capacitor (C1) is coupled to the output node, and wherein a second terminal of the capacitor (C1) is coupled to the second source.

19. The system of claim 17, wherein the capacitor and the inductor are coupled in series, wherein a first terminal of the capacitor (C1) functions as the input of the resonant circuit, wherein a second terminal of the capacitor (C1) is coupled to an output node, wherein a first terminal of the inductor (L1) is coupled to the output node, and wherein a second terminal of the inductor (L1) is coupled to the second source.

* * * * *